United States Patent
Stewart et al.

(10) Patent No.: US 9,711,616 B2
(45) Date of Patent: Jul. 18, 2017

(54) DUAL-CHANNEL FIELD EFFECT TRANSISTOR DEVICE HAVING INCREASED AMPLIFIER LINEARITY

(71) Applicant: Northrop Grumman Systems Corporation, Falls Church, VA (US)

(72) Inventors: Eric J. Stewart, Silver Spring, MD (US); Bettina A. Nechay, Annapolis, MD (US); Karen M. Renaldo, Pasadena, MD (US); Howell G. Henry, Ellicott City, MD (US); Ronald G. Freitag, Catonsville, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 14/581,278

(22) Filed: Dec. 23, 2014

(65) Prior Publication Data

US 2016/0181364 A1   Jun. 23, 2016

(51) Int. Cl.
*H01L 29/02*   (2006.01)
*H01L 29/66*   (2006.01)
(Continued)

(52) U.S. Cl.
CPC .. *H01L 29/66477* (2013.01); *H01L 29/42316* (2013.01); *H01L 29/42364* (2013.01);
(Continued)

(58) Field of Classification Search
CPC ......... H01L 29/42364; H01L 29/42368; H01L 29/66477; H01L 29/42316; H01L 29/475; H01L 29/7786
(Continued)

(56) References Cited

U.S. PATENT DOCUMENTS 3,374,407 A * 3/1968 Olmstead ............ H01L 29/1041
                                                    257/406
2006/0231905 A1* 10/2006 Roedle ................ H01L 29/7835
                                                    257/392
(Continued)

OTHER PUBLICATIONS

Rhys Lewis, "Solid-State Devices and Applications", Elsevier, Oct. 22, 2013, pp. 78-82, ISBN.*
(Continued)

*Primary Examiner* — Sitaramarao S Yechuri
(74) *Attorney, Agent, or Firm* — Andrews Kurth Kenyon LLP; Sean S. Wooden (57) ABSTRACT

A dual-channel field effect transistor (FET) device having increased amplifier linearity and a method of manufacturing same are disclosed. In an embodiment, the device includes a channel layer having a top surface and provided within a channel between a source electrode and a drain electrode. A barrier layer is formed on the channel layer in alternating first and second barrier thicknesses along the channel. The first barrier thicknesses form thinner regions and the second barrier thicknesses form thicker regions. A gate electrode is deposited on the barrier layer. The thinner regions have a first pinch-off voltage and the thicker regions have a larger second pinch-off voltage, such that the thinner and thicker regions are configured to turn on at different points on a drain current-gate voltage transfer curve. Transfer curve linearity is increased as a function of the gate voltage.

17 Claims, 9 Drawing Sheets

(51) Int. Cl.
*H01L 29/423* (2006.01)
*H01L 29/47* (2006.01)
*H01L 29/778* (2006.01)
H01L 29/417 (2006.01)
H01L 29/812 (2006.01)
H01L 29/20 (2006.01)

(52) U.S. Cl.
CPC ........ *H01L 29/475* (2013.01); *H01L 29/7786* (2013.01); *H01L 29/2003* (2013.01); *H01L 29/41758* (2013.01); *H01L 29/812* (2013.01)

(58) Field of Classification Search
USPC ....................................................... 257/404
See application file for complete search history.

(56) References Cited

U.S. PATENT DOCUMENTS

| | | | | |
|---|---|---|---|---|
| 2007/0287404 | A1* | 12/2007 | Arnborg | H01L 21/823412 455/333 |
| 2008/0122015 | A1* | 5/2008 | Baumgartner | H01L 29/0692 257/402 |
| 2009/0309162 | A1* | 12/2009 | Baumgartner | H01L 29/66818 257/368 |
| 2012/0181588 | A1* | 7/2012 | Anderson | H01L 27/14689 257/290 |
| 2013/0020614 | A1* | 1/2013 | Lu | H01L 29/7787 257/194 |

OTHER PUBLICATIONS

Ibrahim Khalil, et al., "Improving the Linearity of GaN HEMTs by Optimizing Expitaxial Structure," IEEE Transactions on Electron Devices, vol. 56, No. 3, Mar. 2009.

Jie Liu, et al., "Al0.3Ga 0.7N/Al0.05Ga0.95N/GaN Composite-Channel HEMTs with Enhanced Linearity," Hong Kong University of Science and Technology, Hong Kong, undated.

Tomas Palacios, et al., "Use of Double-Channel Heterostructures to Improve the Access Resistance and Linearity in GaN-Based HEMTs," IEEE Transactions on Electron Devices, vol. 53, No. 3, Mar. 2006.

* cited by examiner

DUAL-CHANNEL FIELD EFFECT TRANSISTOR DEVICE HAVING INCREASED AMPLIFIER LINEARITY

FIELD

Embodiments are in the technical field of field effect transistors (FETs), particularly dual-channel FETs. More particularly, embodiments disclosed herein relate to dual-channel FET devices having increased amplifier linearity and methods for making same which, inter alia, fosters improved radio-frequency (RF) performance of FETs by reducing interference and crosstalk between signals for both transmit and receive applications.

BACKGROUND

Linearity is important for reducing interference and crosstalk between signals for both transmit and receive applications. Achieving high linearity becomes particularly difficult for emerging applications that seek large bandwidth, high power, and high efficiency simultaneously. As such, these demands are difficult to accomplish through circuit linearization techniques alone.

Presently, FETs are generally inferior to heterojunction bipolar transistors (HBTs) in linearity performance. However, FETs have better power handling capability. Therefore, a FET with improved linearity is desirable. This method is expected to improve the power ratio of carrier (C) to intermodulation (I) signal (C:I) by 5-10 dB for AlGaN/GaN FETs.

For AlGaN/GaN heterostructure field effect transistors (HFETs), techniques used in the state of the art to improve linearity have significant drawbacks. Increasing the barrier thickness: 1) will reduce transconductance ($g_m$) and high frequency performance; 2) a two-channel structure will reduce breakdown voltage; and 3) introducing Al into a GaN channel could reduce mobility and $g_m$.

Thus, it is desirable to provide embodiments of a FET device and method for making same that are able to overcome the above disadvantages in order to increase linearity without degrading breakdown voltage or frequency performance, and with a small impact on peak $g_m$.

SUMMARY

Embodiments are directed to a method for making a dual-channel FET device having increased amplifier linearity comprising: providing a channel layer within a channel, wherein the channel layer has a top surface which is entirely planar; depositing a barrier layer on the top surface of the channel layer, wherein the channel layer and the barrier layer are positioned between a source electrode and a drain electrode; creating alternating first and second barrier thicknesses in the barrier layer along the channel by a technique such as patterned etching, wherein the first barrier thicknesses form first regions and the second barrier thicknesses form second regions which are thicker than the first regions; and depositing a gate electrode on the barrier layer along the channel. The first regions have a first pinch-off voltage and the second regions have a second pinch-off voltage which is larger than the first pinch-off voltage, such that the first and second regions are configured to turn on at different points on a drain current-gate voltage transfer curve when a gate voltage applied to the gate electrode is swept from negative to positive, whereby linearity of the transfer curve is increased as a function of the gate voltage.

In an embodiment, the deposition of the barrier layer comprises: depositing a main portion forming the first barrier thickness residing in the first and second regions while being entirely planar; and forming supplemental portions on the main portion in only the second regions by a technique such as depositing an additional layer on the main portion and removing the additional layer in all locations except in the second regions, such that each of the combinations of the main portions and the supplemental portions in the second regions have a combined thickness forming the second barrier thickness. The supplemental portions may comprise dielectric material such as silicon nitride. In an embodiment, the main portion of the barrier layer comprises aluminum gallium nitride (AlGaN) and the supplemental portions of the barrier layer comprise silicon nitride (SiN). In an embodiment, the ratio of the first barrier thicknesses to the second barrier thicknesses may be in the range of approximately 20-99.9%.

In an embodiment, the FET is an aluminum gallium nitride/gallium nitride (AlGaN/GaN) heterostructure field effect transistor (HFET), and wherein the channel layer comprises GaN and the barrier layer comprises AlGaN.

In an embodiment, the FET is a silicon (Si) metal-oxide semiconductor field effect transistor (MOSFET).

In an embodiment, the FET is a gallium arsenide (GaAs) metal-semiconductor field effect transistor (MESFET).

Embodiments are also directed to a dual-channel FET device manufactured by the method above.

Embodiments are further directed to a method for making a dual-channel FET device having increased amplifier linearity comprising: providing a channel layer within a channel between a source electrode and a drain electrode, wherein the channel layer has a top surface which is entirely planar; depositing a barrier layer on the top surface of the channel layer along the channel; and forming a gate electrode on the barrier layer along the channel, wherein the forming of the gate electrode comprises: forming supplemental portions on spaced regions of the barrier layer; and depositing a main portion on the supplemental portions and on main regions of the barrier layer between the spaced regions, wherein the main portion is comprised of a first metal and the supplemental portions are comprised of a second metal which has a different built-in potential than the first metal. The main region has a first pinch-off voltage and the spaced regions have a second pinch-off voltage which is different than the first pinch-off voltage, such that the main region and the spaced regions are configured to turn on at different points on a drain current-gate voltage transfer curve when a gate voltage applied to the main portion and the supplemental portions of the gate electrode is swept from negative to positive, whereby linearity of the transfer curve is increased as a function of the gate voltage.

In an embodiment, the second pinch-off voltage is larger than the first pinch-off voltage.

In an embodiment, the FET is an aluminum gallium nitride/gallium nitride (AlGaN/GaN) heterostructure field effect transistor (HFET), and wherein the channel layer comprises GaN and the barrier layer comprises AlGaN.

In an embodiment, the FET is a silicon (Si) metal-oxide semiconductor field effect transistor (MOSFET).

In an embodiment, the FET is a gallium arsenide (GaAs) metal-semiconductor field effect transistor (MESFET).

Embodiments are also directed to a dual-channel FET device manufactured by the method above.

BRIEF DESCRIPTION OF THE DRAWINGS

The detailed description will refer to the following drawings in which like numerals refer to like items, and in which.

DETAILED DESCRIPTION

It is to be understood that the figures and descriptions of the present invention may have been simplified to illustrate elements that are relevant for a clear understanding of the present invention, while eliminating, for purposes of clarity, other elements found in a typical RF FET or typical method for making a RF FET. Those of ordinary skill in the art will recognize that other elements may be desirable and/or required in order to implement the present invention. However, because such elements are well known in the art, and because they do not facilitate a better understanding of the present invention, a discussion of such elements is not provided herein. It is also to be understood that the drawings included herewith only provide diagrammatic representations of the presently preferred structures of the present invention and that structures falling within the scope of the present invention may include structures different than those shown in the drawings. Reference will now be made to the drawings wherein like structures are provided with like reference designations.

Embodiments for improving the linearity of FETs for use in RF amplifiers are described. Linearity is important for reducing interference and crosstalk between signals for both transmit and receive applications. Achieving high linearity becomes particularly difficult for emerging applications that seek large bandwidth, high power, and high efficiency simultaneously. As such, these demands are difficult to accomplish through circuit linearization techniques alone. The embodiments described herein propose to improve the linearity of the FET building block by providing a composite FET with regions of different pinch-off voltage within it. As a result, the transfer curve may be shaped to smooth the transconductance ($g_m$) as a function of gate voltage. This method is an improvement over previous approaches because it improves FET linearity without degrading breakdown voltage or frequency performance. Embodiments of a method of making a dual-channel field effect transistor (FET) device having increased amplifier linearity propose to increase linearity with a very small impact on peak $g_m$, no effect on breakdown voltage, and compatibility with high-frequency devices.

To accomplish the improvement to the linearity of FET amplifiers, the pinch-off voltage along the length of the gate stripe is varied. In a simple implementation of an embodiment designed for an AlGaN/GaN heterostructure FET, this involves creating a structure with alternating regions of thicker/thinner barrier along the gate. The thicker regions will have a larger pinch-off voltage, and the thinner regions will have a smaller pinch-off voltage. As the gate voltage is swept from negative to positive, these different regions will turn-on at different points on the transfer curve. This effect may be used to flatten the response of the transconductance as a function of gate voltage, which will improve linearity. A unique advantage presents itself when doing this at the device level, namely the ability of the two regions to share the same ohmic contact or access regions.

Figure 1A:
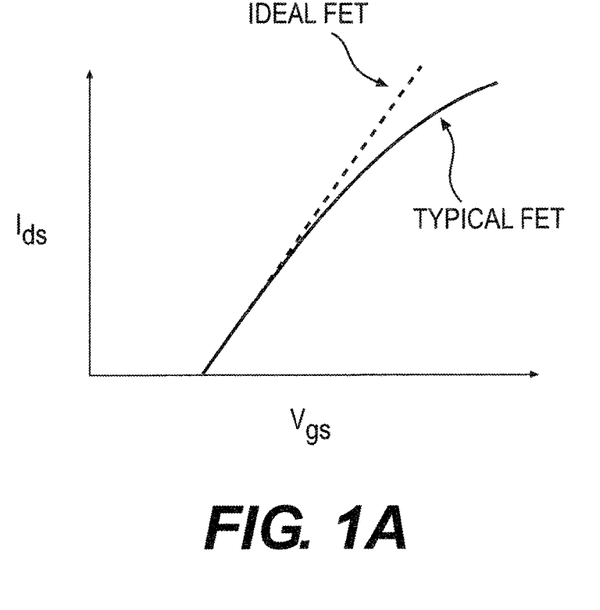
FIG. 1A is a plot of FET transfer curves of drain current ($I_{ds}$) vs. gate voltage ($V_{gs}$) of an embodiment of a FET device and a typical FET device.
Figure 1B:
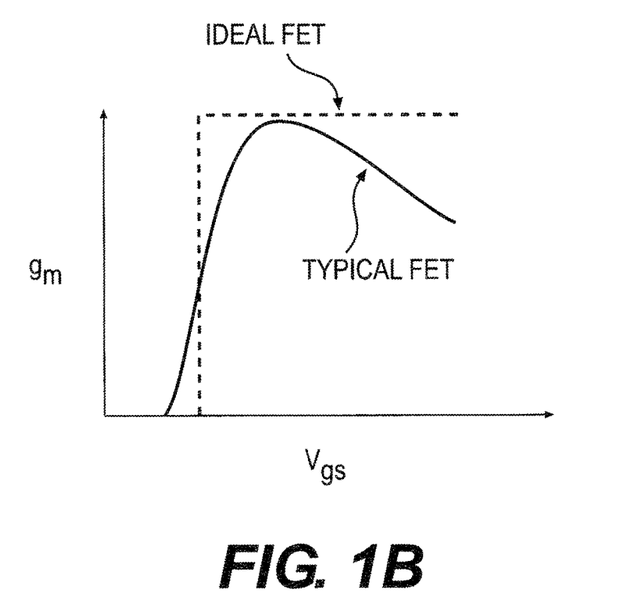
FIG. 1B is a plot of derivatives of the $I_{ds}$-$V_{gs}$ FET transfer curves (i.e., the $g_m$) of FIG. 1A plotted as a function of $V_{gs}$.

FET non-linearity results, in large part, from non-linearity of the FET transfer curve (drain current vs. gate voltage). This is illustrated in FIG. 1A which shows a plot of FET transfer curves of drain current ($I_{ds}$) vs. gate voltage ($V_{gs}$) of an embodiment of a FET device and a typical FET device. As the gate voltage is increased above pinch-off, it is desirable for the drain current to increase on a straight line with constant slope. However, for most real devices, this does not occur. FIG. 1A shows a curve that would be representative of a typical AlGaN/GaN HEMT or Si MOSFET, where the increase in slope of the line gets shallower as the gate voltage becomes more positive. This is illustrated more clearly in FIG. 1B which shows a plot of derivatives of the $I_{ds}$-$V_{gs}$ FET transfer curves (i.e., the $g_m$) of FIG. 1A plotted as a function of gate voltage $V_{gs}$. In an ideal FET, this is perfectly flat. However, as can be seen, the real transconductance falls off from its peak value at the more positive gate voltages. When run as an amplifier, this causes the output power ($P_{out}$) to vary as a non-linear function of the input power ($P_{in}$), creating undesirable frequency components in addition to the desired amplification frequency.

The cause of the non-linearity of the FET transfer curve varies between different technologies. For an AlGaN/GaN HEMT, it is thought that the saturation of electron velocity in the access regions, and perhaps an increased vertical electric field, result in a drop in transconductance at high current. For Si MOSFETs, the universal mobility curve predicts a similar drop in the transconductance for higher current/vertical fields. In a GaAs MESFET, the shape of the transfer curve can be non-linear but in the opposite direction, i.e., $g_m$ decreases at lower current, and increases at higher current. This is due to the distributed nature of carriers in the channel. When the current is low, the carriers being modulated are farther away from the gate compared to when the current is high.

Figure 2A:
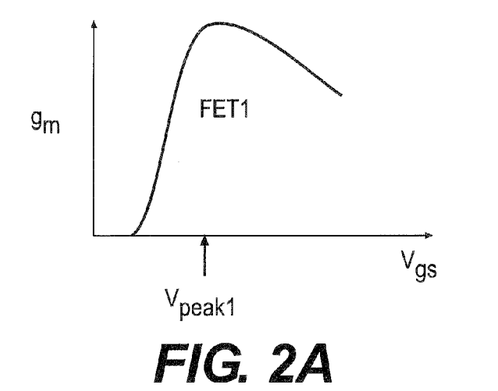
FIG. 2A is a plot of a $g_m$ vs. $V_{gs}$ curve of a first FET (FET1).
Figure 2B:
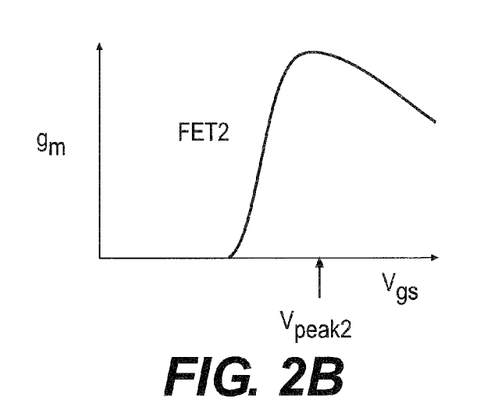
FIG. 2B is a plot of a $g_m$ vs. $V_{gs}$ curve of a second FET (FET2).
Figure 2C:
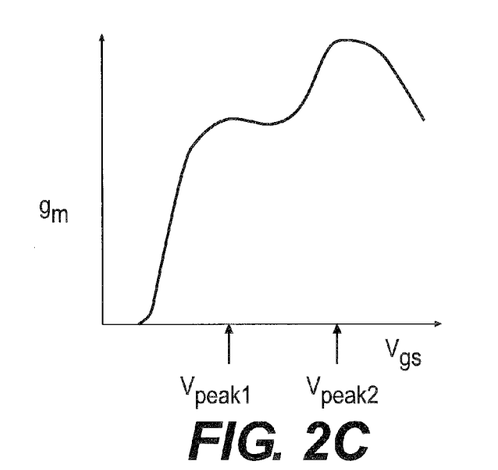
FIG. 2C is a plot of a $g_m$ vs. $V_{gs}$ curve of FET1 and FET2 combined in equal proportions.

Regardless of the cause, embodiments described herein linearize the transfer curve of any of these technologies, by creating regions of different pinch-off voltage within a device. FIGS. 2A-C illustrate this concept. Suppose a FET is a composite of two FETs where the $g_m$ peaks at two different gate-source voltages $V_{peak1}$ (FIG. 2A) and $V_{peak2}$ (FIG. 2B), whose $g_m$ vs. $V_{gs}$ curves are shown. FIG. 2A shows a plot of a $g_m$ vs. $V_{gs}$ curve of a first FET (FET1). FIG. 2B shows a plot of a $g_m$ vs. $V_{gs}$ curve of a second FET (FET2). When these two FETs are combined equally, the transconductance of the two curves simply adds (FIG. 2C). FIG. 2C is a plot of a $g_m$ vs. $V_{gs}$ curve of FET1 and FET2 combined in equal proportions. As can be seen, in the region where the $g_m$ of FET1 would typically drop off, FET2 is turning on and providing a boost in $g_m$. However, in this case, the curve is not yet linear, as the $g_m$ is now increasing at more positive gate biases.

Figure 3A:
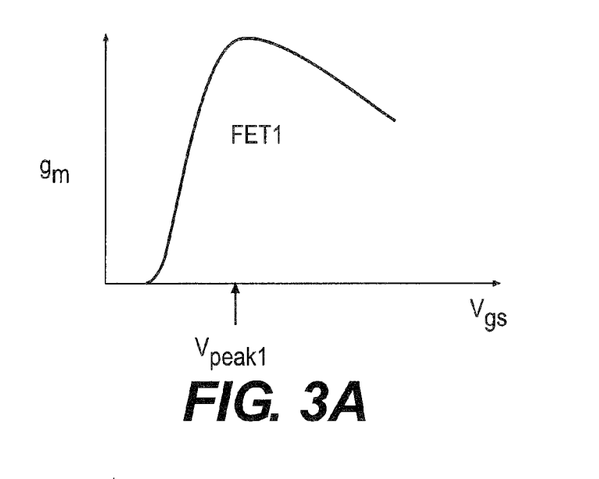
FIG. 3A is a plot of a $g_m$ vs. $V_{gs}$ curve of a first FET (FET1).
Figure 3B:
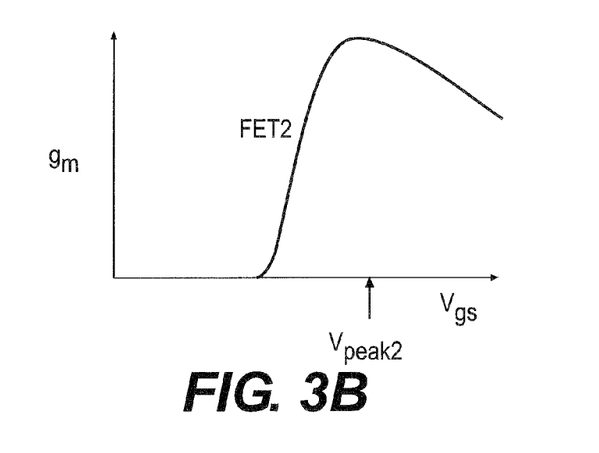
FIG. 3B is a plot of a $g_m$ vs. $V_{gs}$ curve of a second FET (FET2).
Figure 3C:
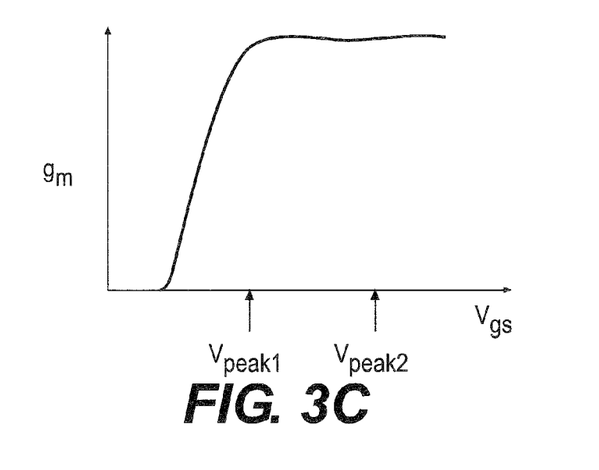
FIG. 3C is a plot of a $g_m$ vs. $V_{gs}$ curve of FET1 and FET2 combined in unequal proportions.

Linearity may be improved by adding the subcomponents together in different proportions as illustrated in FIGS. 3A-3C. FIG. 3A shows a plot of a $g_m$ vs. $V_{gs}$ curve of a first FET (FET1). FIG. 3B shows a plot of a $g_m$ vs. $V_{gs}$ curve of a second FET (FET2). FIG. 3C shows a plot of a $g_m$ vs. $V_{gs}$ curve of FET1 and FET2 combined in unequal proportions. Due to derivative superposition, the $g_m$ curves of two FETs will add in proportion to the periphery of the two devices. As such, the total $g_m$ of a composite FET made up of (x) of FET1 and (1−x) of FET2 will be given by:

$$g_{m(total)} = x \cdot g_{m1} + (1-x) \cdot g_{m2}$$

In the example of FIGS. 2A-2C, the composite FET may be linearized by reducing the proportion of FET2 (see also FIG. 3B) compared to FET1 (see also FIG. 3A). As such, the increase in $g_m$ seen around $V_{gs} = V_{p1}$ is not as dramatic, creating a flatter curve (FIG. 3C). This ability to combine the $g_n$ in different proportions allows tailoring of the shape of the curve for a wide variety of pinch-off voltage and $g_m$ combinations.

Figure 4A:
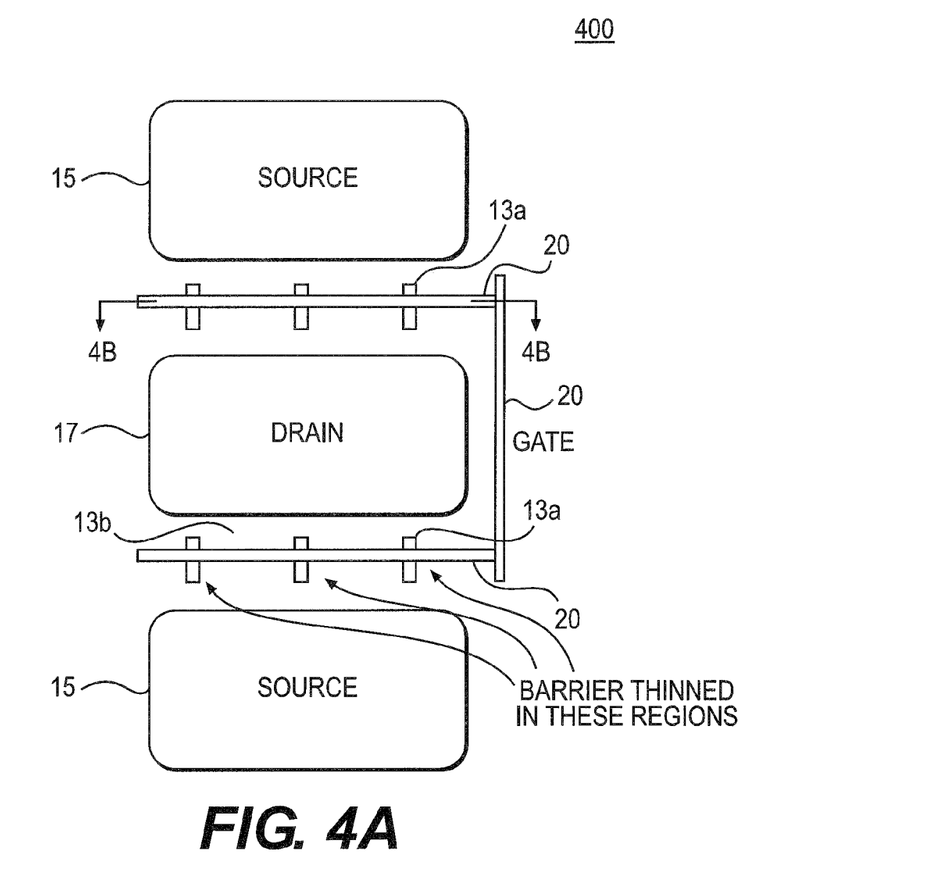
FIG. 4A is a plan view of an embodiment of a dual-channel FET device.
Figure 4B:
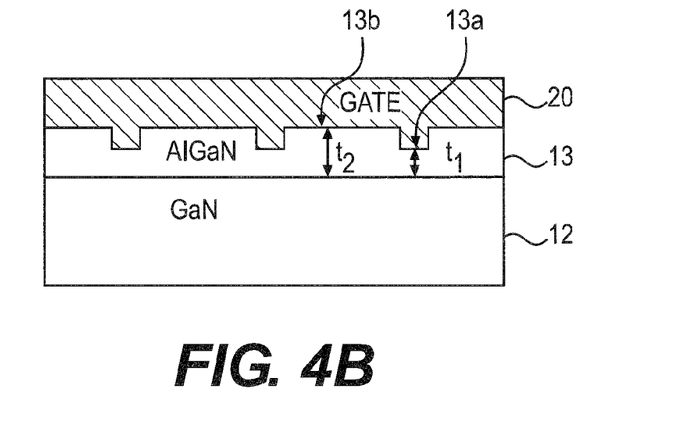
FIG. 4B is a cross-sectional side view of an embodiment of a gate portion of the dual-channel FET device taken along line 4B-4B shown in FIG. 4A.

A practical implementation of an embodiment of this concept in a device structure is shown in FIGS. 4A-4B. FIG. 4A shows a plan view of an embodiment of a dual-channel FET device. FIG. 4B shows a cross-sectional side view of an embodiment of a gate portion of the dual-channel FET device taken along line 4B-4B shown in FIG. 4A. An AlGaN/GaN HFET (also known as a high-electron-mobility-transistor (HEMT)) is depicted in FIGS. 4A-4B, where along the channel, the barrier thickness varies between a thicker value and a thinner value. In this device, the pinch-off for the thinner regions will be lower, and the pinch-off for the thicker regions will be higher. The proportions of the two regions may be easily varied using the lithographic mask. The thinning of the barrier could be performed by an etch or re-growth technique.

Figure 5A:
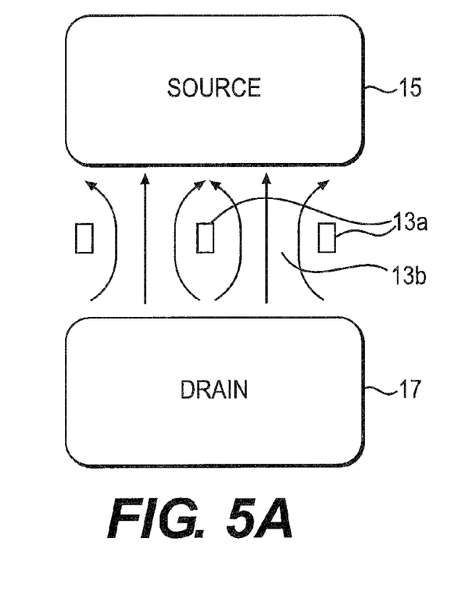
FIG. 5A is a plan view of an embodiment of a dual-channel FET device illustrating channel regions with higher pinch-off voltage conducting and channel regions with lower pinch-off voltage not conducting.
Figure 5B:
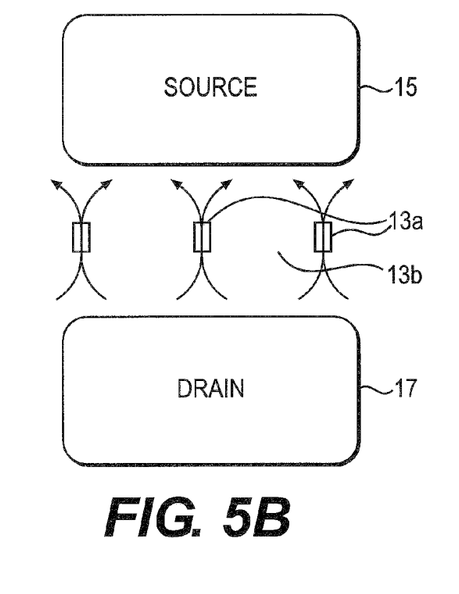
FIG. 5B is a plan view of an embodiment of a dual-channel FET device illustrating channel regions with higher pinch-off voltage not conducting and channel regions with lower pinch-off voltage conducting.

It may also be possible to implement this concept at the circuit level, using two different FET cells and adjusting the gate bias applied to each. However, the implementation on a device level offers unique advantages. This is illustrated in FIGS. 5A and 5B. FIG. 5A shows a plan view of an embodiment of a dual-channel FET device illustrating channel regions with higher pinch-off voltage conducting and channel regions with lower pinch-off voltage not conducting. FIG. 5B shows a plan view of an embodiment of a dual-channel FET device illustrating channel regions with higher pinch-off voltage not conducting and channel regions with lower pinch-off voltage conducting. As shown, the periodicity of the thin barrier/thick barrier regions may be made small compared to the spacing between the source and drain. When the regions with higher pinch-off voltage ($V_{pinch}$) are conducting (and the lower $V_{pinch}$ regions are not), the current will funnel into these regions of the channel from along the entire width of the source/drain contacts. The larger effective width of the source and drain contacts in this situation (i.e., compared to the amount of channel width actually conducting) reduces the effective contact and access resistance of this portion of the FET, resulting in an increase in current and transconductance. The same situation applies to the portion of the channel with smaller $V_{pinch}$. This advantage is not present if two distinct FET cells are used. Also, less chip area is taken up by combining this into one device.

Figure 6A:
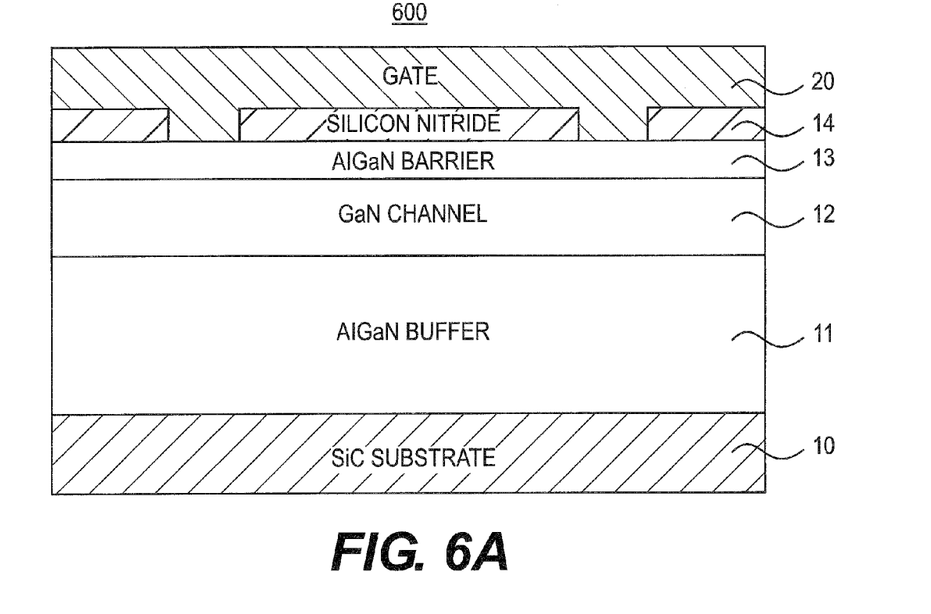
FIG. 6A is a cross-sectional side view of an embodiment of a gate portion of a dual-channel FET device utilizing, inter alia, a barrier layer having alternating thicknesses.
Figure 6B:
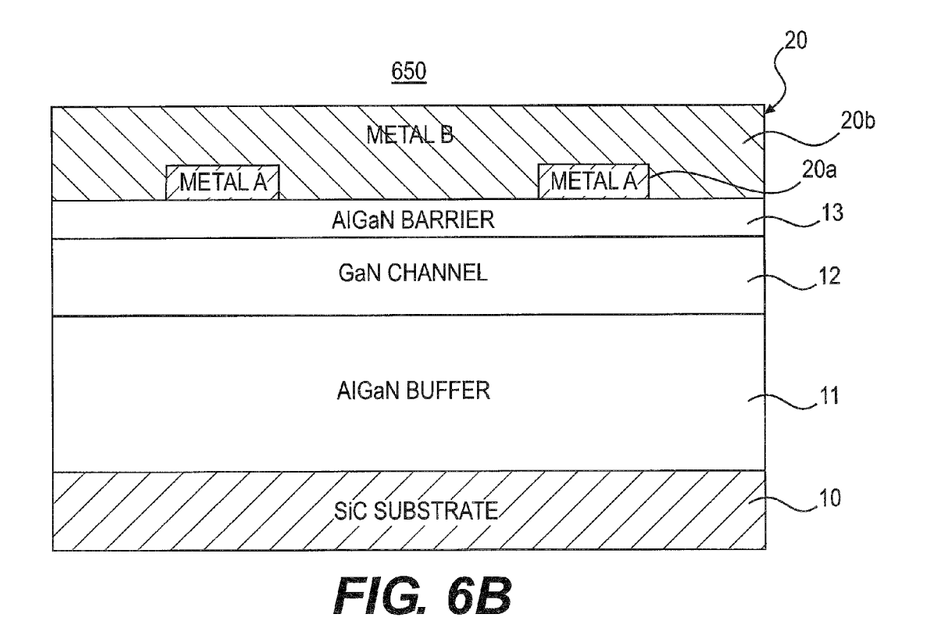
FIG. 6B is a cross-sectional side view of an embodiment of a gate portion of a dual-channel FET device utilizing, inter alia, a gate electrode comprising portions of different metals each having different built-in potentials from each other.

Several other embodiments of this approach are possible in addition to the exemplary embodiment shown in FIGS. 4A-4B. Two of these are illustrated in FIGS. 6A-6B. FIG. 6A shows a cross-sectional side view of an embodiment of a gate portion of a dual-channel FET device utilizing, inter alia, a barrier layer having alternating thicknesses. In FIG. 6A, for an AlGaN/GaN HFET, the AlGaN barrier thickness is held constant, and a thin dielectric layer is used to create the "thick" portions of the barrier. This would be particularly easy to fabricate. Both the embodiments shown in FIGS. 4A/4B and 6a could also apply of the GaAs MESFET or HEMT. A Si MOSFET version of this device might also be created by using two different oxide thicknesses to create the regions with different pinch-off voltages.

FIG. 6B shows another approach, where instead of using the barrier thickness to modify the pinch-off voltage, the Schottky gate metal is varied between different metals with either large or small built-in potentials. In other words, FIG. 6B shows a cross-sectional side view of an embodiment of a gate portion of a dual-channel FET device utilizing, inter alia, a gate electrode comprising portions of different metals each having different built-in potentials from each other. One way to implement an embodiment of a method might be to create patterns of Metal A by a technique such as depositing a blanket film of Metal A, patterning a gate stripe made of Metal B, and then using Metal B as a self-aligned mask to etch Metal A everywhere except for under the gate stripe. Finally, it should also be noted that more than 2 regions (e.g., 3, 4, etc. . . . ) could be employed in any of these implementations and embodiments, further flattening the shape of the transfer curve, but also adding process complexity.

Figure 7A:
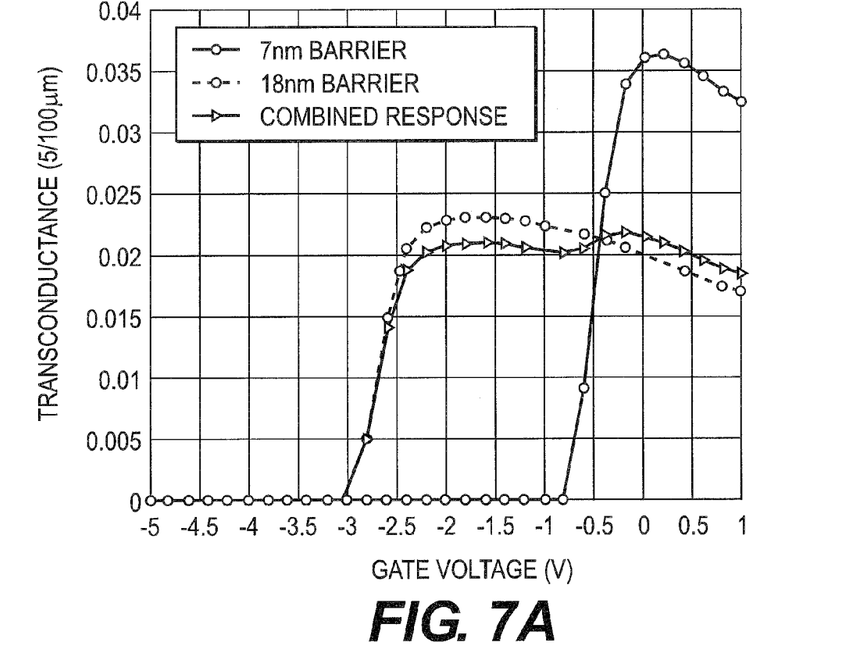
FIG. 7A is a plot of $g_m$ vs. $V_{gs}$ curves and their combined response curve for a HFET having two barrier thicknesses.
Figure 7B:
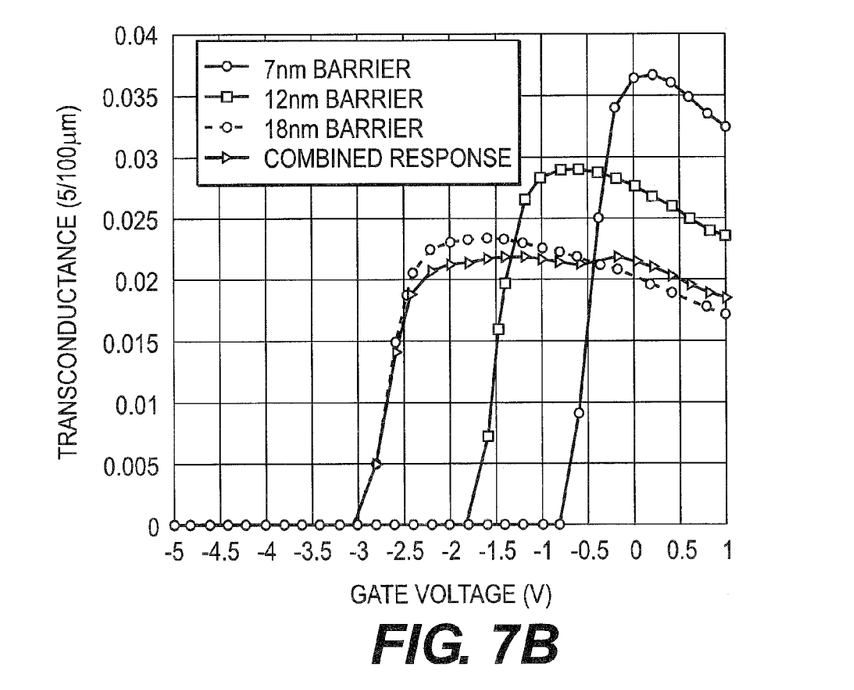
FIG. 7B is a plot of $g_m$ vs. $V_{gs}$ curves and their combined response curve for a HFET having three barrier thicknesses.

Silvaco ATLAS 2D finite element device simulations were performed for various AlGaN HFET barrier heights. The transconductance vs gate voltage response of a combined HFET was calculated from a weighted sum of individual FET responses, as described in previous sections. Optimized responses for two-combined and three-combined HFETs are shown in FIGS. 7A and 7B, respectively. FIG. 7A shows a plot of $g_m$ vs. $V_{gs}$ curves and their combined response curve for a HFET having two barrier thicknesses. FIG. 7B shows a plot of $g_m$ vs. $V_{gs}$ curves and their combined response curve for a HFET having three barrier thicknesses. The combined transconductance is clearly flatter than each individual transconductance curve. Small fluctuations in the combined transconductance for the two-combined FET case (FIG. 7A) may be reduced by adding more FETs in parallel (three-combined FET shown in FIG. 7B) at the expense of higher fabrication complexity.

With reference to FIG. 4A, shown is a plan view of an embodiment of a dual-channel FET device 400. With reference to FIG. 4B, shown is a cross-sectional side view of an embodiment of a gate portion of the dual-channel FET device 400 taken along line 4B-4B shown in FIG. 4A. The FET device 400 comprises a channel layer 12 provided within a channel between a source electrode 15 and a drain electrode 17, wherein the channel layer 12 has a top surface which is entirely planar. The FET device 400 also comprises a barrier layer 13 deposited on the top surface of the channel layer 12 in alternating first and second barrier thicknesses along the channel, wherein the first barrier thicknesses $t_1$ form first regions 13a and the second barrier thicknesses $t_2$ form second regions 13b which are thicker than the first regions 13a. The FET device 400 further comprises a gate electrode 20 deposited on the barrier layer 13 along the channel. The first regions 13a have a first pinch-off voltage and the second regions 13b have a second pinch-off voltage which is larger than the first pinch-off voltage, such that the first and second regions are configured to turn on at different points on a drain current-gate voltage transfer curve when a gate voltage applied to the gate electrode is swept from negative to positive, whereby linearity of the transfer curve is increased as a function of the gate voltage.

In an embodiment, FIG. 6A shows a cross-sectional side view of a gate portion of a dual-channel FET device 600. The FET device 600 includes a barrier layer which comprises: a main portion 13 forming the first barrier thickness residing in the first and second regions while being entirely planar; and supplemental portions 14 deposited on the main portion 13 in only the second regions, such that each of the combinations of the main portions 13 and the supplemental portions 14 in the second regions have a combined thickness forming the second barrier thickness. The supplemental portions 14 may comprise dielectric material such as silicon nitride. In an embodiment, the main portion 13 of the barrier layer comprises aluminum gallium nitride (AlGaN) and the supplemental portions 14 of the barrier layer comprise silicon nitride (SiN). FIG. 6A also shows gate 20, GaN channel 12, AlGaN buffer 11, and SiC substrate 10. In an embodiment, the ratio of the first barrier thicknesses to the second barrier thicknesses may be in the range of approximately 20-99.9%.

In an embodiment, the FET is an aluminum gallium nitride/gallium nitride (AlGaN/GaN) heterostructure field effect transistor (HFET), and wherein the channel layer comprises GaN and the barrier layer comprises AlGaN.

In an embodiment, the FET is a silicon (Si) metal-oxide semiconductor field effect transistor (MOSFET).

In an embodiment, the FET is a gallium arsenide (GaAs) metal-semiconductor field effect transistor (MESFET).

With reference to FIG. 6B, shown is a cross-sectional side view of an embodiment of a gate portion of a dual-channel FET device 650. The FET device 650 comprises a channel layer 12 provided within a channel between a source electrode and a drain electrode, wherein the channel layer 12 has a top surface which is entirely planar. The FET device 650 also comprises a barrier layer 13 deposited on the top surface of the channel layer 12 along the channel. The FET device 650 further comprises a gate electrode 20 formed on the barrier layer 13 along the channel, wherein the gate electrode 20 comprises supplemental portions 20a formed on spaced regions of the barrier layer 13, and a main portion 20b deposited on the supplemental portions 20a and on main regions of the barrier layer 13 between the spaced regions, wherein the main portion 20b is comprised of a first metal and the supplemental portions 20a are comprised of a second metal which has a different built-in potential than the first metal. The main region has a first pinch-off voltage and the spaced regions have a second pinch-off voltage which is different than the first pinch-off voltage, such that the main region and the spaced regions are configured to turn on at different points on a drain current-gate voltage transfer curve when a gate voltage applied to the main portion 20b and the supplemental portions 20a of the gate electrode 20 is swept from negative to positive, whereby linearity of the transfer curve is increased as a function of the gate voltage. FIG. 6B also shows GaN channel 12, AlGaN buffer 11, and SiC substrate 10.

In an embodiment, the second pinch-off voltage is larger than the first pinch-off voltage.

In an embodiment, the FET is an aluminum gallium nitride/gallium nitride (AlGaN/GaN) heterostructure field effect transistor (HFET), and wherein the channel layer comprises GaN and the barrier layer comprises AlGaN.

In an embodiment, the FET is a silicon (Si) metal-oxide semiconductor field effect transistor (MOSFET).

In an embodiment, the FET is a gallium arsenide (GaAs) metal-semiconductor field effect transistor (MESFET).

Figure 8:
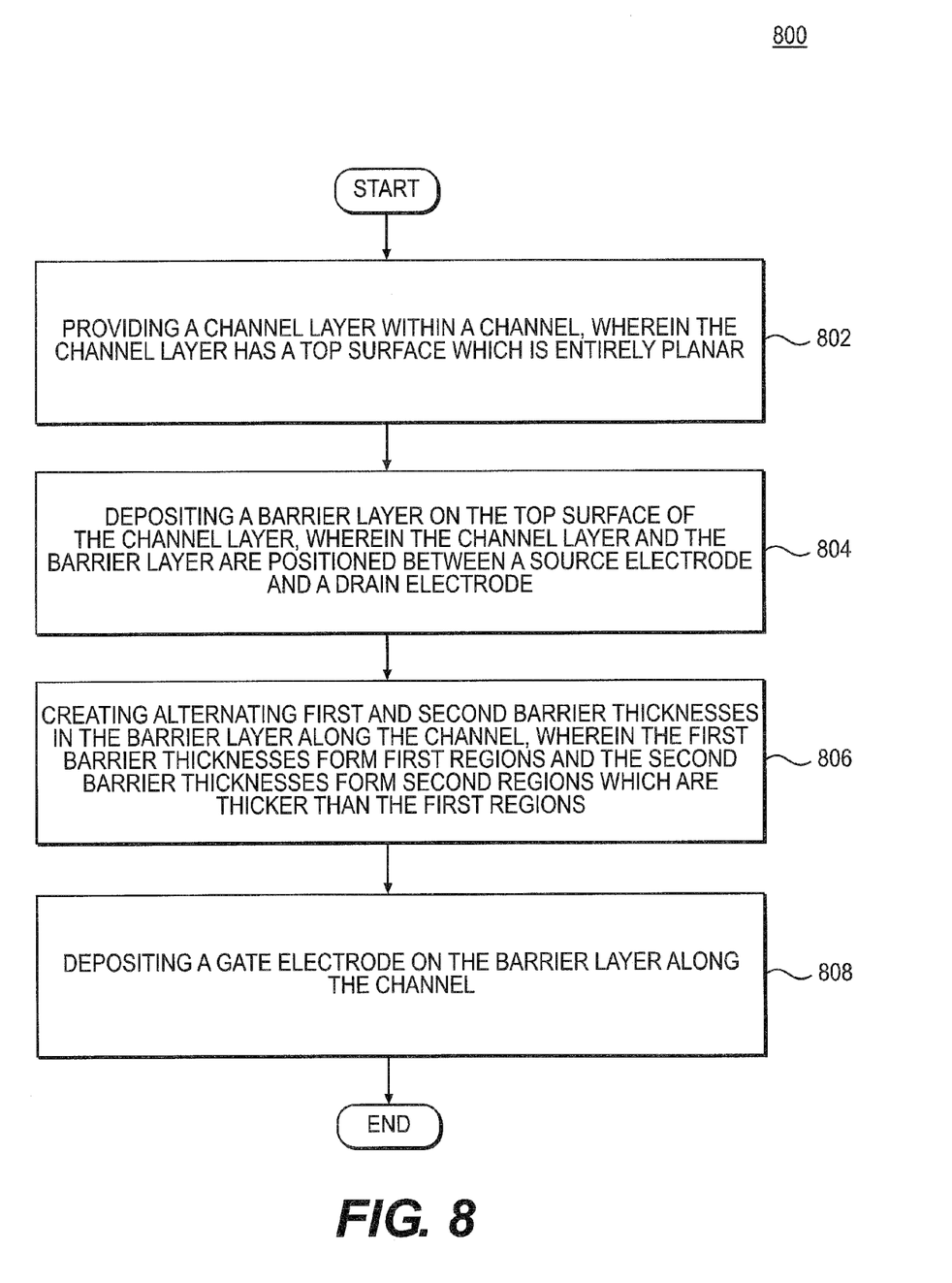
FIG. 8 is a flowchart illustrating an embodiment of a method for making a dual-channel FET device having increased amplifier linearity by utilizing, inter alia, a barrier layer having alternating thicknesses.

With reference to FIG. 8, shown is a flowchart illustrating an embodiment of a method 800 for making a dual-channel field effect transistor (FET) device having increased amplifier linearity. Embodiments are directed to a method 800 for making a dual-channel field effect transistor (FET) device having increased amplifier linearity comprising: providing a channel layer within a channel, wherein the channel layer has a top surface which is entirely planar (block 802); depositing a barrier layer on the top surface of the channel layer, wherein the channel layer and the barrier layer are positioned between a source electrode and a drain electrode (block 804); creating alternating first and second barrier thicknesses in the barrier layer along the channel by a technique such as patterned etching, wherein the first barrier thicknesses form first regions and the second barrier thicknesses form second regions which are thicker than the first regions (block 806); and depositing a gate electrode on the barrier layer along the channel (block 808). The first regions have a first pinch-off voltage and the second regions have a second pinch-off voltage which is larger than the first pinch-off voltage, such that the first and second regions are configured to turn on at different points on a drain current-gate voltage transfer curve when a gate voltage applied to the gate electrode is swept from negative to positive, whereby linearity of the transfer curve is increased as a function of the gate voltage.

In an embodiment, the deposition of the barrier layer comprises: depositing a main portion forming the first barrier thickness residing in the first and second regions while being entirely planar; and forming supplemental portions on the main portion in only the second regions by a technique such as depositing an additional layer on the main portion and removing the additional layer in all locations except in the second regions, such that each of the combinations of the main portions and the supplemental portions in the second regions have a combined thickness forming the second barrier thickness. The supplemental portions may comprise dielectric material such as silicon nitride. In an embodiment, the main portion of the barrier layer comprises aluminum gallium nitride (AlGaN) and the supplemental portions of the barrier layer comprise silicon nitride (SiN).

In an embodiment, the ratio of the first barrier thicknesses to the second barrier thicknesses may be in the range of approximately 20-99.9%.

In an embodiment, the FET is an aluminum gallium nitride/gallium nitride (AlGaN/GaN) heterostructure field effect transistor (HFET), and wherein the channel layer comprises GaN and the barrier layer comprises AlGaN.

In an embodiment, the FET is a silicon (Si) metal-oxide semiconductor field effect transistor (MOSFET).

In an embodiment, the FET is a gallium arsenide (GaAs) metal-semiconductor field effect transistor (MESFET).

Figure 9:
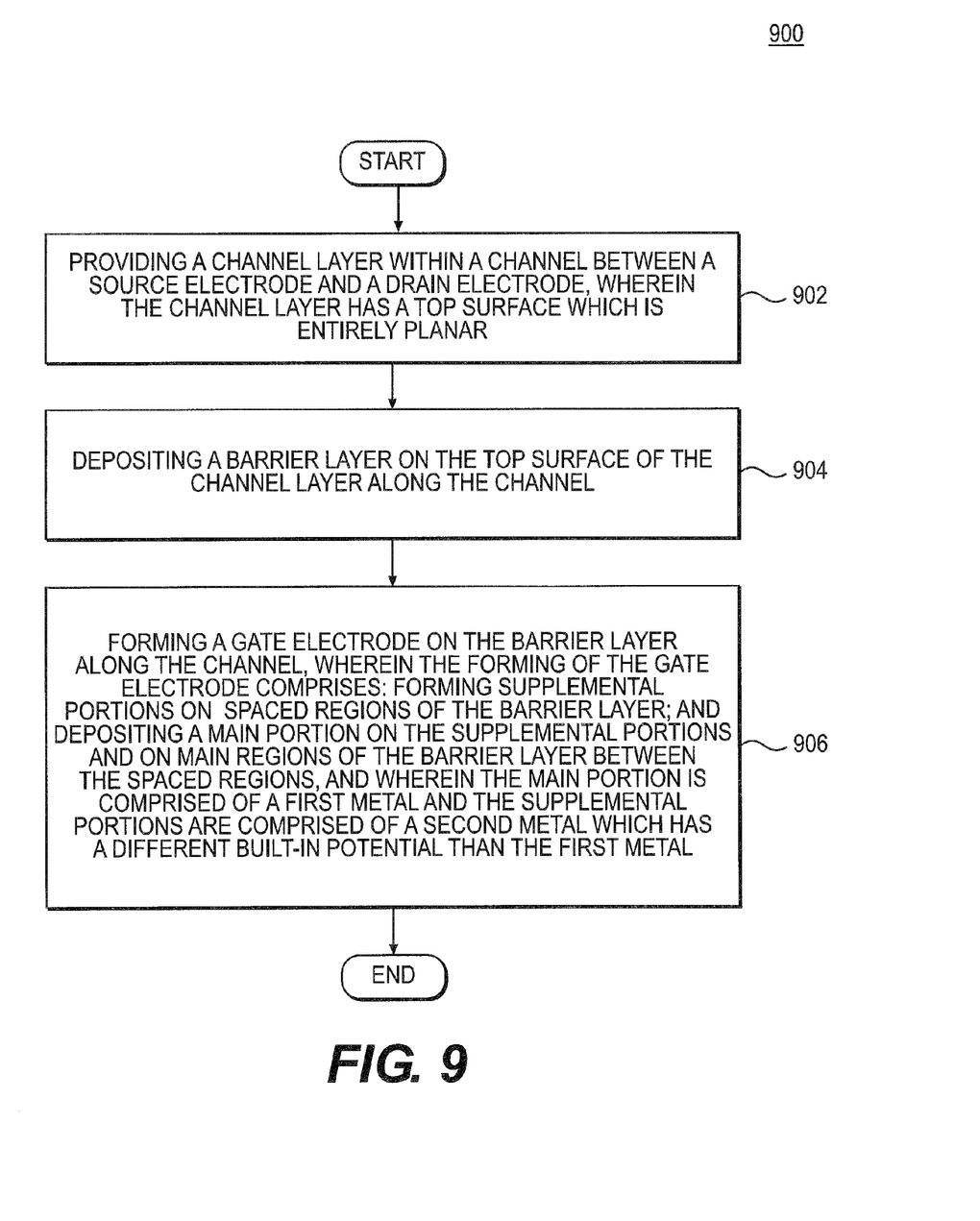
FIG. 9 is a flowchart illustrating an embodiment of a method for making a dual-channel FET device having increased amplifier linearity by utilizing, inter alia, a gate electrode comprising portions of different metals each having different built-in potentials from each other.

With reference to FIG. 9, shown is a flowchart illustrating an embodiment of a method 900 for making a dual-channel field effect transistor (FET) device having increased amplifier linearity. Embodiments are directed to a method 900 for making a dual-channel field effect transistor (FET) device having increased amplifier linearity comprising: providing a channel layer within a channel between a source electrode and a drain electrode, wherein the channel layer has a top surface which is entirely planar (block 902); depositing a barrier layer on the top surface of the channel layer along the channel (block 904); and forming a gate electrode on the barrier layer along the channel, wherein the forming of the gate electrode comprises: forming supplemental portions on spaced regions of the barrier layer; and depositing a main portion on the supplemental portions and on main regions of the barrier layer between the spaced regions, wherein the main portion is comprised of a first metal and the supplemental portions are comprised of a second metal which has a different built-in potential than the first metal (block 906). The main region has a first pinch-off voltage and the spaced regions have a second pinch-off voltage which is different than the first pinch-off voltage, such that the main region and the spaced regions are configured to turn on at different points on a drain current-gate voltage transfer curve when a gate voltage applied to the main portion and the supplemental portions of the gate electrode is swept from negative to positive, whereby linearity of the transfer curve is increased as a function of the gate voltage.

In an embodiment, the second pinch-off voltage is larger than the first pinch-off voltage.

In an embodiment, the FET is an aluminum gallium nitride/gallium nitride (AlGaN/GaN) heterostructure field effect transistor (HFET), and wherein the channel layer comprises GaN and the barrier layer comprises AlGaN.

In an embodiment, the FET is a silicon (Si) metal-oxide semiconductor field effect transistor (MOSFET).

In an embodiment, the FET is a gallium arsenide (GaAs) metal-semiconductor field effect transistor (MESFET).

For simplicity purposes, it is noted that the elements illustrated in FIGS. 4A, 4B, 5A, 5B, 6A, and 6B may not be drawn to scale.

Embodiments disclosed herein utilizing dual-channel FET devices having increased amplifier linearity and methods for making same foster improved RF performance of FETs by reducing interference and crosstalk between signals for both transmit and receive applications.

The contemplated modifications and variations specifically mentioned above are considered to be within the spirit and scope of the present invention.

Those of ordinary skill in the art will recognize that various modifications and variations may be made to the embodiments described above without departing from the spirit and scope of the present invention. It is therefore to be understood that the present invention is not limited to the particular embodiments disclosed above, but it is intended to cover such modifications and variations as defined by the following claims.

The invention claimed is:

1. A method for making a dual-channel field effect transistor (FET) device having increased amplifier linearity comprising:
   providing a channel layer within a channel, wherein the channel layer has a top surface which is entirely planar;
   depositing a barrier layer on the top surface of the channel layer, wherein:
     the channel layer and the barrier layer are positioned between a source electrode and a drain electrode; and
     the barrier layer comprises alternating first regions having a first thickness and second regions having a second thickness that is greater than the first thickness;
   depositing a gate electrode on the barrier layer along the channel;
   wherein the first regions have a first pinch-off voltage and the second regions have a second pinch-off voltage which is larger than the first pinch-off voltage, such that the first and second regions are configured to turn on at different points on a drain current—gate voltage transfer curve when a gate voltage applied to the gate electrode is swept from negative to positive, whereby linearity of the transfer curve is increased as a function of the gate voltage,
   wherein a periodicity of the alternating first and second regions is smaller than a length of the channel.

2. The method of claim 1 wherein depositing the barrier layer comprises:
   depositing a main portion forming the first thickness residing in the first and second regions while being entirely planar; and
   forming supplemental portions on the main portion in only the second regions, such that each of the combinations of the main portions and the supplemental portions in the second regions have a combined thickness forming the second barrier thickness.

3. The method of claim 2 wherein the supplemental portions comprise dielectric material.

4. The method of claim 2 wherein the main portion of the barrier layer comprises aluminum gallium nitride (AlGaN) and the supplemental portions of the barrier layer comprise silicon nitride (SiN).

5. The method of claim 1 wherein the ratio of the first thicknesses to the second thicknesses is in the range of approximately 20-99.9%.

6. The method of claim 1 wherein the FET is an aluminum gallium nitride/gallium nitride (AlGaN/GaN) heterostructure field effect transistor (HFET), and wherein the channel layer comprises GaN and the barrier layer comprises AlGaN.

7. The method of claim 1 wherein the FET is a silicon (Si) metal-oxide semiconductor field effect transistor (MOSFET).

8. The method of claim 1 wherein the FET is a gallium arsenide (GaAs) metal-semiconductor field effect transistor (MESFET).

9. A dual-channel FET device having increased amplifier linearity made by the method of claim 1.

10. A dual-channel field effect transistor (FET) device having increased amplifier linearity comprising:
    a channel layer provided within a channel between a source electrode and a drain electrode, wherein the channel layer has a top surface which is entirely planar;

a barrier layer:
provided on the top surface of the channel layer and comprising alternating first regions having a first thickness and second regions having a second thickness that is greater than the first thickness;
a gate electrode deposited on the barrier layer along the channel;
wherein the first regions have a first pinch-off voltage and the second regions have a second pinch-off voltage which is larger than the first pinch-off voltage, such that the first and second regions are configured to turn on at different points on a drain current—gate voltage transfer curve when a gate voltage applied to the gate electrode is swept from negative to positive, whereby linearity of the transfer curve is increased as a function of the gate voltage,
wherein a periodicity of the alternating first and second regions is smaller than a length of the channel.

11. The dual-channel FET device of claim 10 wherein the barrier layer comprises:
a main portion forming the first thickness residing in the first and second regions while being entirely planar; and
supplemental portions formed on the main portion in only the second regions, such that each of the combinations of the main portions and the supplemental portions in the second regions have a combined thickness forming the second thickness.

12. The dual-channel FET device of claim 11 wherein the supplemental portions comprise dielectric material.

13. The dual-channel FET device of claim 11 wherein the main portion of the barrier layer comprises aluminum gallium nitride (AlGaN) and the supplemental portions of the barrier layer comprise silicon nitride (SiN).

14. The dual-channel FET device of claim 10 wherein the ratio of the first thicknesses to the second thicknesses is in the range of approximately 20-99.9%.

15. The dual-channel FET device of claim 10 wherein the FET is an aluminum gallium nitride/gallium nitride (AlGaN/GaN) heterostructure field effect transistor (HFET), and wherein the channel layer comprises GaN and the barrier layer comprises AlGaN.

16. The dual-channel FET device of claim 10 wherein the FET is a silicon (Si) metal-oxide semiconductor field effect transistor (MOSFET).

17. The dual-channel FET device of claim 10 wherein the FET is a gallium arsenide (GaAs) metal-semiconductor field effect transistor (MESFET).

* * * * *